(12) United States Patent
Isoda et al.

(10) Patent No.: US 6,389,381 B1
(45) Date of Patent: May 14, 2002

(54) METHOD AND APPARATUS FOR CALCULATING DELAY TIMES IN SEMICONDUCTOR CIRCUIT

(75) Inventors: Masahito Isoda; Takashi Yoneda; Rieko Suzuki, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/037,063

(22) Filed: Mar. 9, 1998

(30) Foreign Application Priority Data

Jun. 13, 1997 (JP) ............................................. 9-157060

(51) Int. Cl.$^7$ .......................... G06F 9/455; G06F 17/50
(52) U.S. Cl. ................................. 703/19; 703/14; 716/6
(58) Field of Search .............................. 703/2, 13, 19, 703/14; 702/29; 716/6

(56) References Cited

U.S. PATENT DOCUMENTS

| | | | | |
|---|---|---|---|---|
| 5,204,564 A | * | 4/1993 | Ochiai | 327/262 |
| 5,548,526 A | * | 8/1996 | Misheloff | 364/491 |
| 5,559,715 A | * | 9/1996 | Misheloff | 364/488 |
| 5,617,325 A | * | 4/1997 | Schaefer | 364/488 |
| 5,819,205 A | * | 10/1998 | Mani | 702/79 |
| 5,875,114 A | * | 2/1999 | Kagatani et al. | 364/489 |

OTHER PUBLICATIONS

Croix et al., J. A Fast and Accurate Technique to Optimize Characterization Tables for Logic Synthesis, 9/97, ACM 0–89791–847–9/97.*
Dutta, Shetti, and Lusky; 'A comprehensive delay model for CMOS Inverters'; Aug. 1995, IEEE Journal of Solid–State Circuits, vol. 30 No. 8, pp 864–871.*

* cited by examiner

*Primary Examiner*—Russell W. Frejd
(74) *Attorney, Agent, or Firm*—Staas & Halsey LLP

(57) ABSTRACT

A method and apparatus for calculating circuit delay times efficiently arranges and stores data to reduce system memory requirements, which allows computers without large storage devices, such as conventional personal computers with limited hard disk space, to be used for testing preliminary device designs, Delay time ratio coefficient values representing a ratio of a delay time determined by values of dependency factors having a large correlation with one another to a predetermined reference delay time of a circuit element are stored in a coefficient table. The dependency factors include process condition, in use or operational temperature, and first and second operational supply voltages.

14 Claims, 7 Drawing Sheets

Fig.10

```
NAME : XXX ;
PARM ;
    SOURCE=TYPE1 ;
ENDPARM;
DELAY;
    Signal path statement 1:Delay time information statement 1;
    Signal path statement 2:Delay time information statement 2;
        . . .
    Signal path statement n:Delay time information statement n;
ENDDELAY;
ENDNAME ;

NAME : YYY ;
PARM ;
    SOURCE=TYPE2 ;
ENDPARM;
DELAY;
    Signal path statement 1:Delay time information statement 1;
    Signal path statement 2:Delay time information statement 2;
        . . .
    Signal path statement n:Delay time information statement n;
ENDDELAY;
ENDNAME ;
```

METHOD AND APPARATUS FOR CALCULATING DELAY TIMES IN SEMICONDUCTOR CIRCUIT

BACKGROUND OF THE INVENTION

The present invention relates generally to a method and apparatus for calculating delay times in a semiconductor circuit. More particularly, the present invention relates to a delay time calculating method and apparatus suitable for use in logic simulation, combination and timing analysis during a design phase of a custom LSI or semi-custom integrated circuit device.

Increasing the integration scale of semiconductor devices results in a longer time for performing logic simulation or the like of logic circuits. In order to shorten the design time, therefore, it is important to decrease logic design and test time for semiconductor devices.

One of the tools to test whether a semiconductor device is designed as specified is timing simulation. The timing simulation performs logic circuit simulation in light of the delay times of the interconnection and individual circuits (gates, cells, etc.) of a semiconductor device, and inspects the circuit timings, such as the occurrence of hazards, under conditions close to actual circuit operations. The timing simulation uses a tool (delay time calculating apparatus) for estimating the delay time of a semiconductor device. The delay time calculating apparatus estimates the delay time of a semiconductor device using design data (logic circuit data, layout pattern data, etc.) of the semiconductor device.

The delay time of a semiconductor device depends on, or is affected by, factors (dependency factors) such as the supply voltage supplied to the semiconductor device, the fabrication process and the temperature of the semiconductor device while in use. The delay time calculating apparatus estimates the delay time in accordance with the dependency factors. Timing simulation is executed in accordance with the estimated delay time to inspect the operational timing of the semiconductor device.

To reduce the power dissipation of a system, a semiconductor device which operates on a relatively low supply voltage may be used. When a semiconductor device which operates on a low voltage and a semiconductor device which operates on a voltage higher than the low voltage are present in the same system, however, a high voltage signal may be supplied to the low-voltage semiconductor device. In this case, a low-voltage semiconductor device which is compatible both with a high supply voltage (first operational supply voltage) and a low supply voltage (second operational supply voltage) is provided. Specifically, the semiconductor device includes an internal circuit which operates on a low voltage and an interface circuit which converts the voltage of an external signal (high voltage) to a low voltage suitable for the internal circuit. When operational supply voltages of 2.5 V and 3 V are supplied to a semiconductor device, for example, the internal circuit operates on 2.5 V. The interface circuit converts an external input signal having an amplitude of 3 V to a signal having an amplitude of 2.5 V, and transmits the converted signal to the internal circuit. The interface circuit also converts a signal of 2.5 V to a signal of 3 V. Similarly, in a semiconductor device designed according to another specification which is compatible with 2 V and 2.8 V, the interface circuit converts a signal having an amplitude of 2.8 V to a signal having an amplitude of 2 V.

The delay time of a semiconductor circuit device is relatively short for a high supply voltage device and relatively long for a low supply voltage device. The delay time calculating apparatus has delay time data which is prepared on the basis of dependency factors like the supply voltage, fabrication process and temperature in use. Referring to FIG. 1, for each circuit element, the delay time data has a matrix table 71 having dimensions which correspond to the number of dependency factors. The matrix table 71 is used to store delay time ratios for various conditions. For example, when the dependency factors of one circuit element are a process condition, a temperature in use and two operational supply voltages V1 and V2, the matrix table 71 is designed as four-dimensional. Specifically, the matrix table 71 includes a plurality of three-dimensional matrix tables 73 of the process condition, the operational supply voltage V1 and the temperature in use. Each three-dimensional matrix table 73 corresponds to a respective operational supply voltage V2 as a fourth dependency factor. That is, each three-dimensional matrix table 73 includes a plurality of two-dimensional tables 72 of the process condition and the operational supply voltage V1 based on the respective operational supply voltage V2.

The value of each delay time ratio stored in the matrix table 71 represents the ratio acquired by dividing a delay time under the condition of the several dependency factors by a reference delay time under the reference condition. The reference delay time is a delay time set under predetermined circuit usage conditions of the semiconductor device. The delay time is calculated as follows. First, the value of one delay time ratio corresponding to a given circuit use condition is acquired from the matrix table 71. Then, the value of the delay time ratio is multiplied by the reference delay time, yielding a delay time of a circuit element under a given circuit use condition. Such delay time is calculated for each circuit of the semiconductor device. The timing of the semiconductor device is then checked using the calculated delay times.

Increasing the number of dependency factors of a circuit element results in an increase in the number of matrix tables. For example, ten two-dimensional matrix tables 72 are needed for three dependency factors, whereas one hundred two-dimensional matrix tables 72 are required for four dependency factors when the number of each of dependency factors is ten. The increased number of matrix tables therefore leads to a longer time for computing the delay time under circuit use conditions, which increases the time required to check the device timing.

Recently, a high-performance personal computer is provided. However, a memory device, such as a hard disk of the personal computer can not entirely store data when the quantity of data is increased, so that it is impossible to use the personal computer.

Accordingly, it is an object of the present invention to provide a delay time calculating method and apparatus which does not unduly increase the amount of data used in the computation of a delay time.

SUMMARY OF THE INVENTION

Briefly stated, the invention provides a method of computing delay times of circuit elements of a semiconductor device. The method includes the following operations: preparing at least one coefficient table storing a plurality of delay time ratio coefficient values thereon, each of the delay time ratio coefficient values representing a ratio of a delay time determined by values of a plurality of dependency factors having a large correlation with one another to a predetermined reference delay time of a circuit element; acquiring the delay time ratio coefficient value associated with at least one of the plurality of dependency factors from the coefficient table; and computing a delay time of a circuit element using the acquired delay time ratio coefficient value and a reference delay time.

The present invention provides an apparatus for computing delay times of circuit elements of a semiconductor device. The apparatus includes the following elements: at least one coefficient table storing a plurality of delay time ratio coefficient values, each of the delay time ratio coefficient values representing a ratio of a delay time determined by values of a plurality of dependency factors having a large correlation with one another to a predetermined reference delay time of a circuit element; and a processing unit for acquiring a delay time ratio coefficient value associated with at least one of the plurality of dependency factors from the coefficient table, and computing a delay time of a circuit element using the acquired delay time ratio coefficient value and a reference delay time.

The present invention provides a method of generating a coefficient table for use in computing delay times of circuit elements of a semiconductor device. The method includes the following operations: computing a plurality of delay time ratio coefficient values, each of the delay time ratio coefficient values representing a ratio of a delay time determined by values of a plurality of dependency factors having a large correlation with one another to a predetermined reference delay time of a circuit element; and storing the plurality of delay time ratio coefficient values in the coefficient table.

The present invention provides a storage product including a recording medium where a computer readable program code for computing delay times of circuit elements of a semiconductor device is recorded thereon. The program executes the following operations: preparing at least one coefficient table storing a plurality of delay time ratio coefficient values, each of the delay time ratio coefficient values representing a ratio of a delay time determined by values of a plurality of dependency factors having a large correlation with one another to a predetermined reference delay time of a circuit element; acquiring the delay time ratio coefficient value associated with at least one of the plurality of dependency factors from the coefficient table; and computing a delay time of a circuit element using the acquired delay time ratio coefficient value and a reference delay time.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 10 shows functional model data used in the delay time calculating process according to the second embodiment of the present invention.

DETAILED DESCRIPTION OF THE PREFERRED EMBODIMENTS

Figure 2:
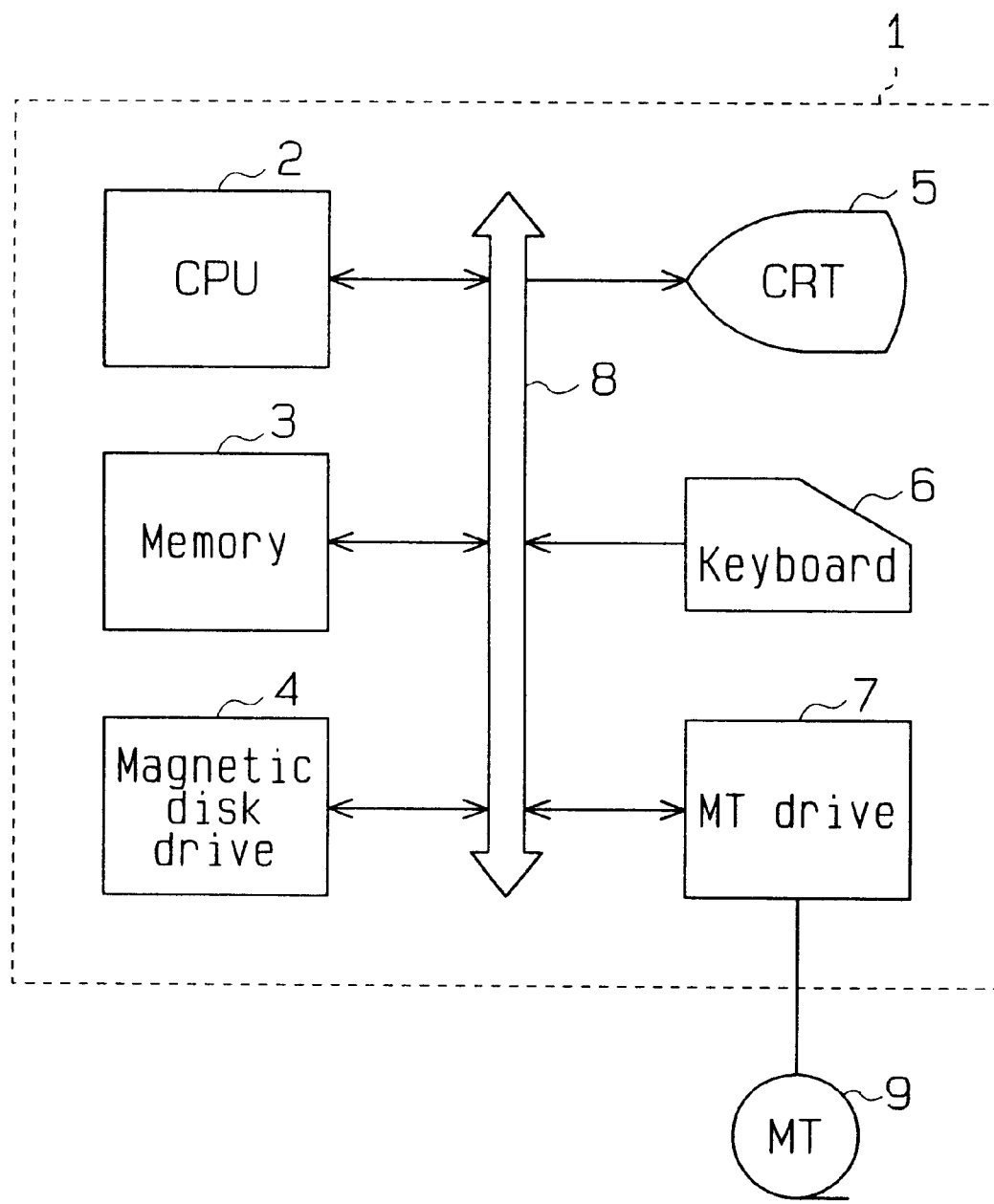
FIG. 2 is a schematic block diagram of a delay time calculating apparatus according to a first embodiment of the present invention.

A delay time calculating apparatus according to a first embodiment of the present invention will now be described with reference to the accompanying drawings. Referring to FIG. 2, a delay time calculating apparatus 1 comprises a central processing unit (CPU) 2, a memory 3, a hard disk drive or magnetic disk drive 4, a display unit 5, a keyboard 6 and a magnetic tape drive 7, which are respectively connected to each other via a bus 8. As will be understood by those of ordinary skill in the art, other storage devices may be substituted for the storage devices disclosed (i.e., the memory 3, the disk drive 4, and the tape drive 7), such as Flash type memory and CD-ROM or optical disk type memory devices.

The magnetic disk drive 4 stores program data of the delay time calculating process during operation. The program data is read from a magnetic tape 9 or other storage. The CPU 2 controls the magnetic tape drive 7 to read the program data from the magnetic tape 9 and stores the program data on the magnetic disk drive 4. The CPU 2 executes the delay time calculating process in accordance with instruction input via the keyboard 6 or other input device by an operator.

Figure 3:
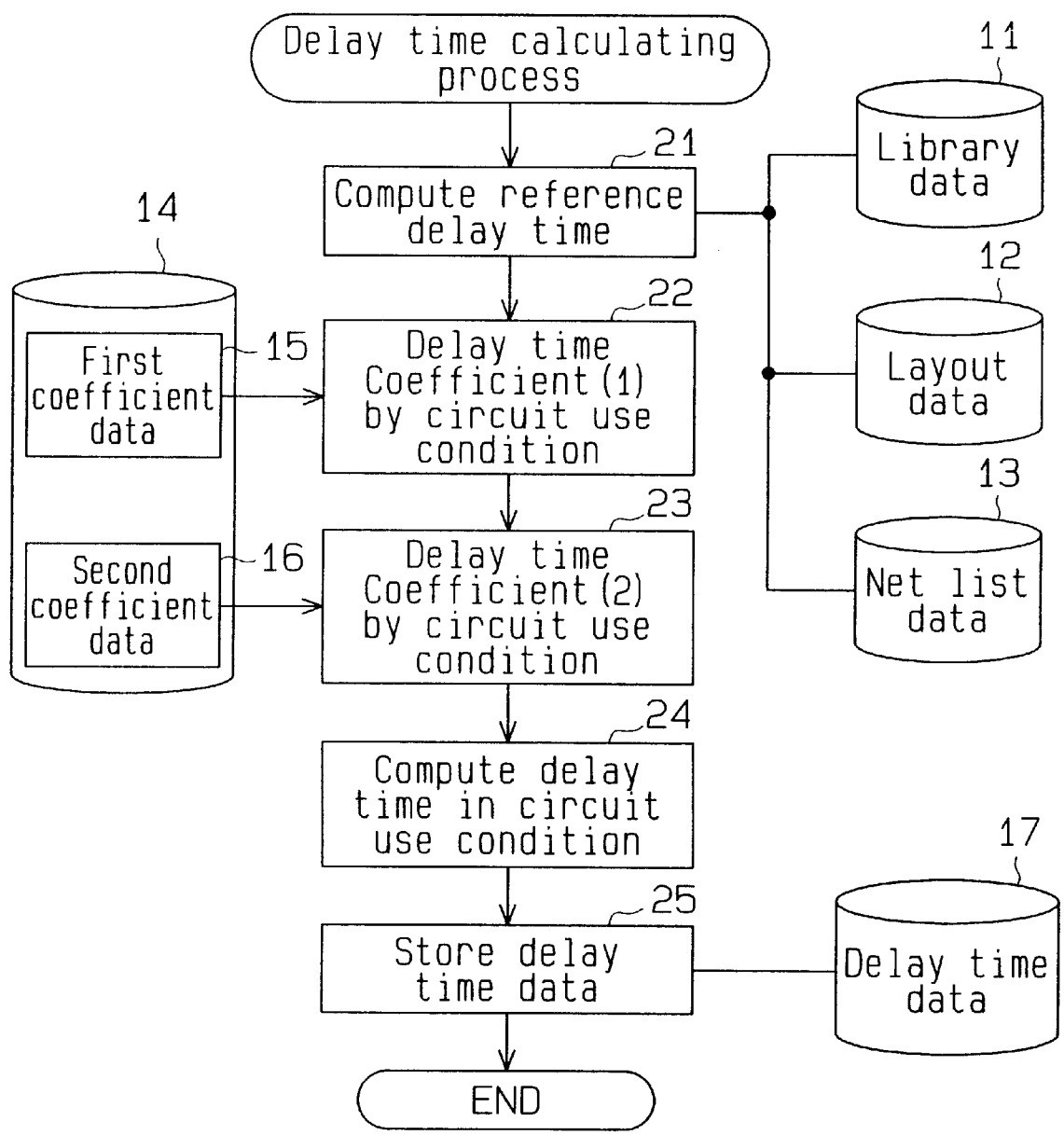
FIG. 3 is a flowchart of a delay time calculating process according to the first embodiment of the present invention.

The program data transferred to the magnetic disk drive 4 includes a plurality of data files 11 to 17, as shown in FIG. 3. The first data file 11 comprises cell library data of a plurality of circuit elements, including cells and macro cells, which are used in designing a semiconductor device. The cell library data includes data of logic values of an output signal with respect to logic values of an input signal, data on the type and voltage of a required operational power supply, and reference delay time data. The reference delay time data are a delay times in each cell (circuit element), which are previously calculated using known circuit simulation programs (e.g., SPICE).

The second data file 12 comprises layout data of the semiconductor device. The third data file 13 comprises logical connection data (net list data) of the semiconductor device. The layout data and net list data are previously generated in the circuit design stage and layout design stage using a CAD device (not shown), as is known by those of ordinary skill in the art.

Stored in the fourth data file 14 are first and second delay time ratio coefficient tables (hereinafter called first and second coefficient tables) 15 and 16 for each circuit element. The first and second coefficient tables 15 and 16 both include a matrix table of delay time ratio coefficient data for a plurality of dependency factors dependent on the delay time of each circuit element which have a large correlation with one another. The delay time ratio coefficient data represent the ratio acquired by dividing a delay time under a predetermined circuit use condition by the reference delay time. According to the present embodiment, the first coefficient table 15 includes a matrix table of delay time ratio coefficient data for three dependency factors: the process condition, the device temperature during operation and the first operational supply voltage V1. The second coefficient table 16 includes a matrix table of delay time ratio coefficient data for two dependency factors: the first and second operational supply voltages V1 and V2.

The CPU 2 computes the delay time of each circuit element under the desired circuit use condition using data of the first and second coefficient tables 15 and 16. More specifically, the CPU 2 first calculates the delay time of a semiconductor device 31 (FIG. 5) for a reference use condition by using various types of data (cell library data, layout data and net list data) stored in the first to third data files 11–13. The CPU 2 then reads a reference delay time of each circuit element from the first data file 11, and computes a reference delay time tpd0 in view of a delay time which reflects the load of the interconnection of the circuit element. The CPU 2 calculates a delay time tpd under the desired circuit use condition using the reference delay time tpd0.

The first coefficient data is represented as DMAG1 (p, t, V1) and the second coefficient data is represented DMAG2 (V1, V2). The delay time tpd is expressed by the following equation:

$$tpd=tpd0 \times DMAG1(t, p, V1) \times DMAG2(V1, V2) \quad (1)$$

A matrix table of delay time ratio coefficient data about a new dependency factor which has a relative value to one dependency factor and a second dependency factor is formed in the first and second coefficient tables 15 and 16. When the first operational supply voltage V1 is a reference dependency factor in the second coefficient table 16, for example, the differential voltage ΔV between the first operational supply voltage V1 and the second operational supply voltage V2 is set as a new dependency factor. In other words, the first operational supply voltage V1 and the differential voltage ΔV are set as a dependency factor in the second coefficient table 16. In this case, the delay time tpd is given by the following equation:

$$tpd=tpd0 \times DMAG1(t, p, V1) \times DMAG2(V1, \Delta V) \quad (2)$$

The differential voltage ΔV may be the voltage obtained with the second operational supply voltage V2 taken as a reference dependency factor. In this case, the second coefficient data in the second coefficient table 16 is DMAG2 (V2, ΔV), and the first coefficient data is represented as DMAG1 (t, p, V2).

The CPU 2 computes the delay time of each circuit element using the same first and second coefficient tables 15 and 16 for a plurality of circuit elements of the same kind. This computation reduces the number of tables stored on the magnetic disk drive 4. In other words, the magnetic disk drive 4 may have a small capacity and still provide sufficient storage space. A plurality of circuit elements of the same kind receive the same number of signals and output the same number of signals, but have different transistor electric characteristics (e.g., different or varying amounts of output current). The delay times of circuit elements of the same type are calculated using the same delay time ratio coefficient data.

The CPU 2 stores the computed delay time data of each circuit element in the fifth data file 17 which is used for timing inspection. An unillustrated timing inspection device (timing simulator) performs timing inspection on the semiconductor device using the computed delay time data of each circuit element from the fifth data file 17 and various kinds of data (layout data and net list data) from the second and third data files 12 and 13. Based on the result of the inspection, signal paths (nets) and circuit elements are identified which do not meet the specifications and accordingly, alteration of such circuit elements (e.g., the driving performance) and signal paths are performed.

Figure 5:
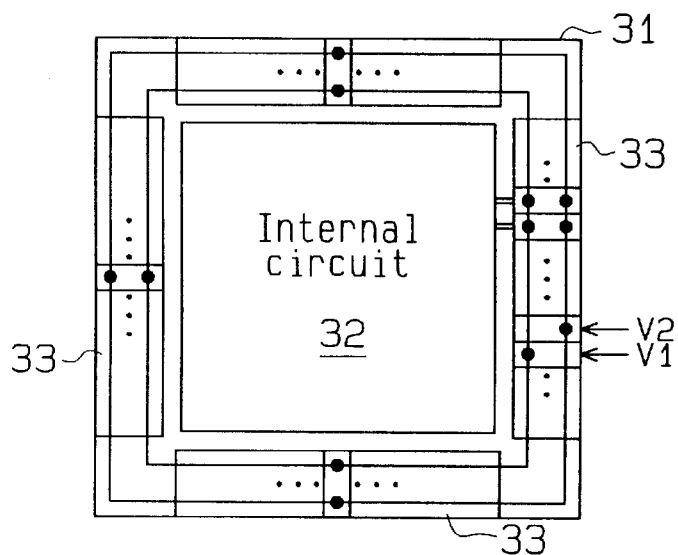
FIG. 5 is a schematic plan view of a semiconductor device adapted for the delay time calculating process according to the first embodiment of the present invention.

The semiconductor device 31, shown in FIG. 5, receives power from the first and second operational power supplies V1 and V2. In this example, the voltage of the first operational power supply V1 is 2.5 V and the voltage of the second operational power supply V2 is 3.3 V. To decrease the power dissipation of the semiconductor device 31, the first operational supply voltage V1 is supplied to an internal circuit 32. The delay time of the internal circuit 32 therefore depends on the first operational supply voltage V1 which is a dependency factor with respect to the delay time of the internal circuit 32.

Figure 6:
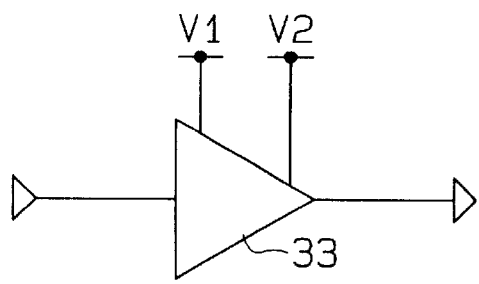
FIG. 6 is a circuit diagram of an interface circuit of the semiconductor device of FIG. 5.

As shown in FIG. 6, an interface circuit 33 (which serves as an input circuit in this case) receives the first and second operational supply voltages V1 and V2, converts a signal having the amplitude of the second operational supply voltage V2 to a signal having the amplitude of the first operational supply voltage V1, and transmits the converted signal to the internal circuit 32. The interface circuit 33 may also serve as an output circuit, in which case it converts a signal having the amplitude of the first operational supply voltage V1 from the internal circuit 32 to a signal having the amplitude of the second operational supply voltage V2, and transmits the converted signal to the external unit. Thus, the interface circuit 33 depends on the first and second operational supply voltages V1 and V2, which are dependency factors with respect to the delay time of the interface circuit 33.

The delay times of the internal circuit 32 and interface circuit 33 also depend on the fabrication process condition and the temperature of the device 31 while in use. The delay time of the semiconductor device 31 is therefore calculated with the process condition, the temperature in use, the first operational supply voltage V1 and the second operational supply voltage V2 as dependency factors. Of these dependency factors, the process condition, the temperature in use and the first operational supply voltage V1 have a large correlation. There is also a large correlation between the first operational supply voltage V1 and the second operational supply voltage V2.

Figure 4:
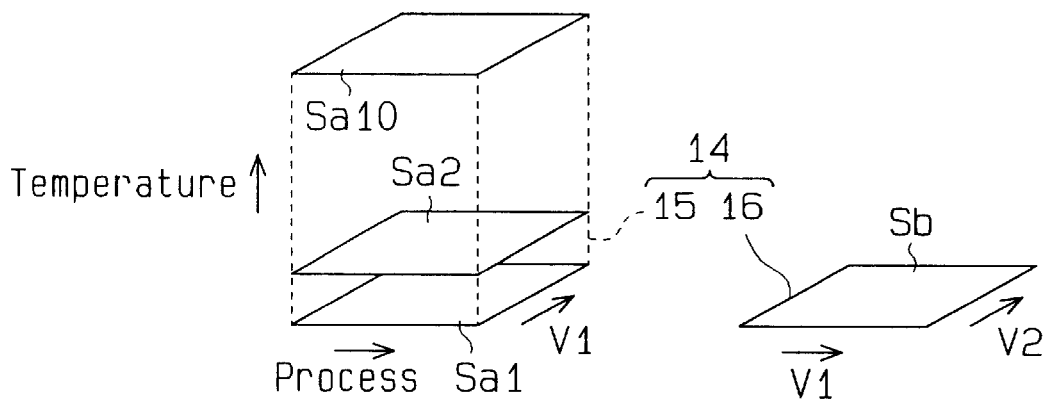
FIG. 4 is a diagram showing a matrix table of delay time data according to the first embodiment of the present invention.

As shown in FIG. 4, the first coefficient table 15 includes a three-dimensional matrix table of three dependency factors of the process condition, the temperature in use and the first operational supply voltage V1. Suppose that each dependency factor has ten different values. That is, the semiconductor device 31 is fabricated on the basis of ten process conditions. Ten in-use temperatures are provided, for example, 15° C., 20° C., . . . , and 60° C., set every 5° C. in the range of 15° C. to 60° C. Ten first operational supply voltages V1 are 2.4 V, 2.5 V, . . . , and 3.3 V, for example, set every 0.1 V over the range of 2.4 V to 3.3 V. Ten second operational supply voltages V2 are 2.4 V, 2.5 V, . . . , and 3.3 V, for example, likewise set every 0.1 V over the range of 2.4 V to 3.3 V. In this case, the first coefficient table 15 includes a three-dimensional matrix table comprising ten two-dimensional tables Sa1 to Sa10. Each two-dimensional table includes the process condition and the first operational supply voltage V1. The second coefficient table 16 comprises a single two-dimensional table Sb of the first and second operational supply voltages V1 and V2. The delay time ratio coefficient table of the circuit element which has the process condition, the temperature in use and the first and second operational supply voltages V1 and V2 as dependency factors includes eleven two-dimensional matrix tables. Note that the delay time ratio coefficient table of the circuit element which is supplied with one operational supply voltage includes ten two-dimensional tables Sa1 to Sa10, excluding the two-dimensional table Sb.

Figure 1:
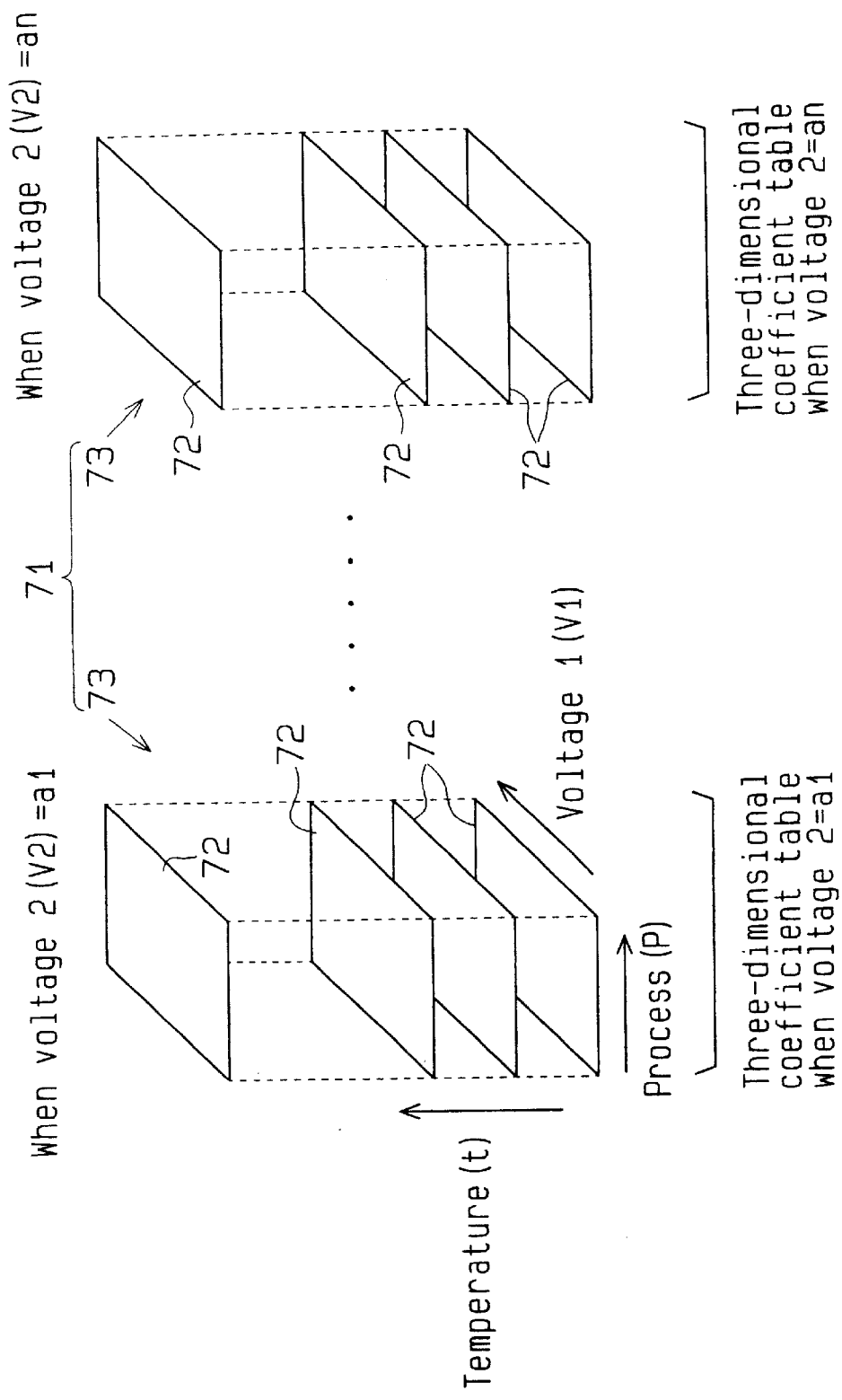
FIG. 1 is a diagram showing a conventional matrix table of delay time data for a circuit element.

When four dependency factors each having ten different values are adapted to the conventional delay time ratio coefficient table 71 shown in FIG. 1, the table 71 includes one hundred two-dimensional tables. In contrast, the coefficient table of the present invention (having four dependency factors of ten values) includes eleven two-dimensional matrix tables. Thus, the number of tables is reduced to approximately one ninth of the conventionally required number. This reduction in the number of required tables reduces the amount of data in the coefficient tables stored on the magnetic disk drive 4. In other words, it is possible to store a sufficient number of coefficient tables on the magnetic disk drive 4 having a small capacity. Further, because of the decreased amount of coefficient data required, the coefficient data is read from the magnetic disk drive 4 faster than in the prior art.

The operation of the delay time calculating apparatus 1 will now be discussed with reference to the flowchart in FIG. 3. To begin with, a description will be given of the case where the delay time of the interface circuit 33 is computed. The CPU 2 calculates the reference delay time tpd0 of the interface circuit 33 using cell library data (reference delay time) from the first data file 11 in step 21. In the next step 22, the CPU 2 reads the first coefficient data DMAG1 (t, p, V1) from the associated first coefficient table 15 in the fourth data file 14. In step 23, the CPU 2 reads the second coefficient data DMAG2 (V1, V2) from the associated second coefficient table 16 in the fourth data file 14. In step 24, the CPU 2 calculates the delay time tpd under a given circuit use condition of the interface circuit 33 in accordance with the aforementioned equation (1) using the reference delay time data tpd0 and the first and second coefficient data DMAG1 (t, p, V1) and DMAG2 (V1, V2). Then, the CPU 2 stores the calculated delay time tpd of the interface circuit 33 in the fifth data file 17 in step 25.

The CPU 2 preferably calculates the reference delay times of all the circuit elements which constitute the semiconductor device 31 in step 21, and repeats the sequence of processes in steps 2 to 25 for each circuit element. The CPU 2 may repeat the sequence of processes in steps 21 to 25 for each circuit element.

A description will now be given of the case where the delay time of each circuit element in the internal circuit 32 is computed. The CPU 2 computes the reference delay time tpd0 using the reference delay time from the first data file 11. The CPU 2 reads the first coefficient data DMAG1 (t, p, V1) from the associated first coefficient table 15 in the fourth data file 14 and multiplies the reference delay time tpd0 by the first coefficient data DMAG1 (t, p, V1). Thus, the delay time tpd under the desired use condition of the circuit element is given by the following equation (3)

$$tpd = tpd0 \times DMAG1(t, p, V1) \quad (3)$$

The CPU 2 stores the delay time of the circuit element in the fifth data file 17.

A delay time calculating apparatus 1 according to the second embodiment of the present invention will be described below with reference to the accompanying drawings. Like or same reference numerals are given to those components which are the same as the corresponding components of the first embodiment.

Figure 7:
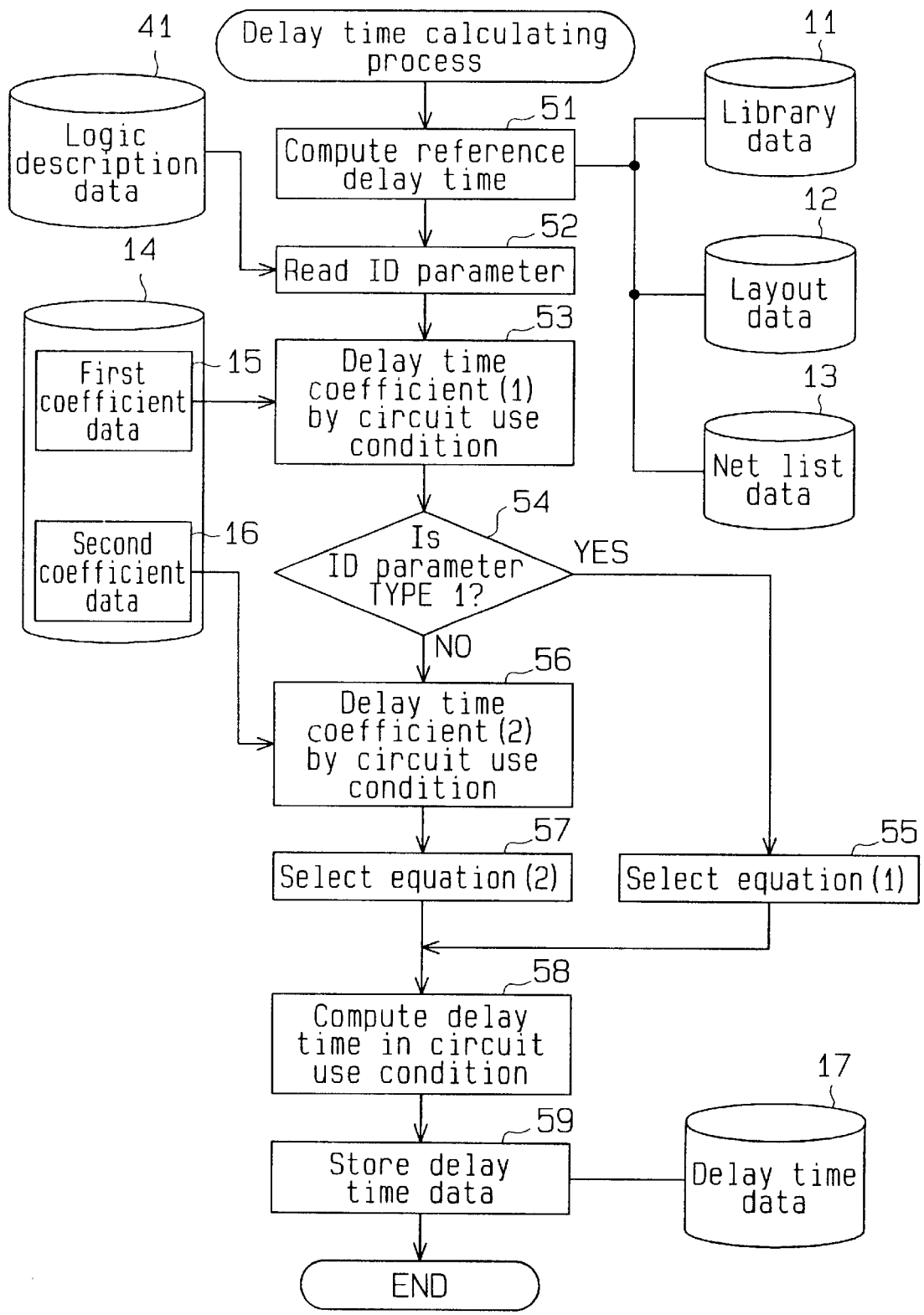
FIG. 7 is a flowchart of a delay time calculating process according to a second embodiment of the present invention.

The magnetic disk drive 4 stores a sixth data file 41 shown in FIG. 7. The sixth data file 41 stores functional model data (which will be discussed later specifically) of circuit elements for designing a semiconductor device 31a (see FIG. 8).

Figure 8:
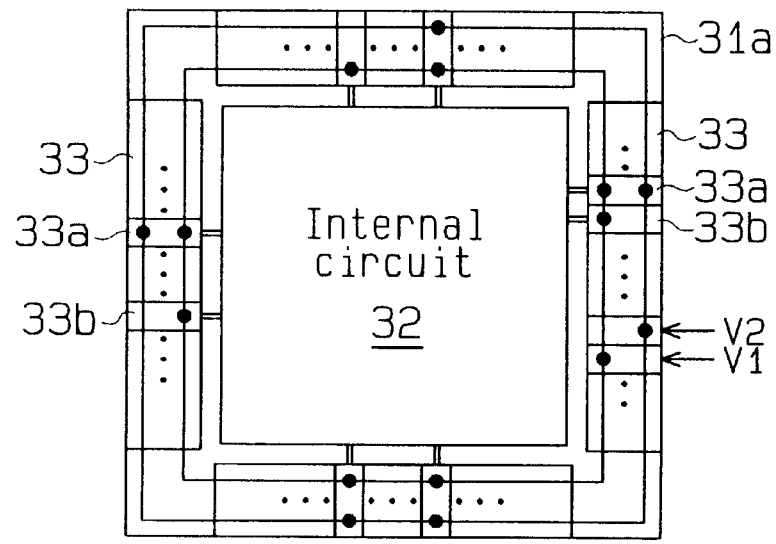
FIG. 8 is a schematic plan view of a semiconductor device adapted for the delay time calculating process according to the second embodiment of the present invention.
Figure 9:
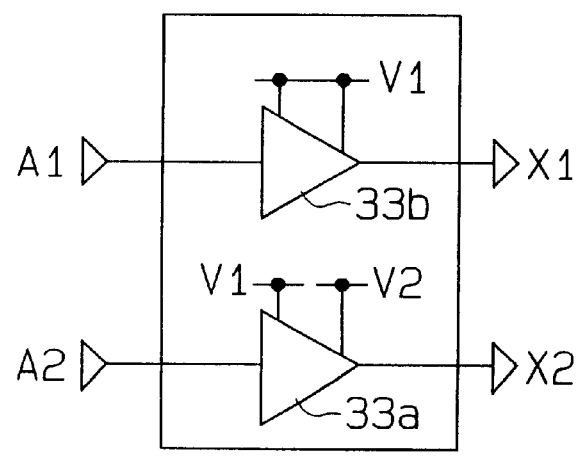
FIG. 9 is a circuit diagram of two interface circuits of the semiconductor device of FIG. 8.

The semiconductor device 31a in FIG. 8 can cope with two input signals: the first input signal A1 having the amplitude of the first operational supply voltage V1 and the second input signal A2 having the amplitude of the second operational supply voltage V2. As shown in FIGS. 8 and 9, the semiconductor device 31a has a first interface circuit 33a which receives power from the first and second operational power supplies V1 and V2 and a second interface circuit 33b which receives power from the first operational power supply V1. The first interface circuit 33a converts the input signal A2 to an output signal X2 which has the amplitude of the second operational supply voltage V2, and transmits the output signal X2 to the internal circuit 32. The second interface circuit 33b transmits the input signal A1 as an output signal X1 to the internal circuit 32.

As the first and second interface circuits 33a and 33b are constituted of the same type of circuit elements, their delay times under a given circuit use condition are computed using the same coefficient data. It is to be noted however that the dependency factors of the delay time of the first interface circuit 33a are the process condition, the temperature in use and the first and second operational supply voltages V1 and V2, while the dependency factors of the delay time of the second interface circuit 33b are the process condition, the temperature in use and the first operational supply voltage V1. Therefore, the delay time of the first interface circuit 33a is calculated according to the aforementioned equation (1) (or the equation (2)), and the delay time of the second interface circuit 33b is calculated according to the equation (3). That is, the second coefficient data 16 is not needed in computing the delay time of the second interface circuit 33b.

Because of the reasons given above, the CPU 2 should selectively use the equation (1) (or the equation (2)) and the equation (3). To facilitate the selection, each of the functional models of the circuit elements includes an identification (ID) code for selection. The CPU 2 selects the proper equation according to the ID code to compute the delay times of the first and second interface circuits 33a and 33b. The time required for the calculation of the delay times is shortened in this manner.

The functional model data has one or both of a logic model and a delay time model of a circuit element. The logic model includes a logical equation which equivalently describes the function or operation of the associated circuit element. The delay time model includes delay time information in a signal path of the associated circuit element.

FIG. 10 shows the structure of delay time models for two circuit elements. The delay time models have a model description area between keywords "NAME" and "ENDNAME", an information description area between keywords "DELAY" and "ENDDELAY" in the model description area, and a various-information parameter description area between keywords "PARM" and "END-PARM". Information on one circuit element is described in the model description area. The keyword "NAME" for one circuit element of the first interface circuit 33a is described as "YYY" and the keyword "NAME" for one circuit element of the second interface circuit 33b is described as "XXX".

Described in the information description area (i.e., between "DELAY" and "ENDDELAY")are a signal path statement indicative of a signal change between the input signal and the output signal, and a delay time information statement for that signal change. For instance, a signal path statement indicating that the output signal X2 of the second interface circuit 33b varies with respect to the input signal A2 and a delay time information statement for the change are described.

A keyword indicative of the type of a dependency factor and an ID parameter for the dependency factor associated with that keyword are described for each circuit element in the parameter description area (i.e., between "PARM" and "ENDPARM"). For example, for the circuit element XXX, the keyword of the dependency factor for the operational power supply is "SOURCE" and the parameter is "TYPE1". The parameter "TYPE1" indicates that there is one operational power supply. For the circuit element YYY, the keyword of the dependency factor is "SOURCE" and the parameter is "TYPE2". The parameter "TYPE2" indicates that there are two operational power supplies. Although the ID parameter is described for each circuit model in the second embodiment, it may be described for each signal path. Further, the initial values of ID parameters for all of the circuit models may be set and an ID parameter may be described only for the necessary circuit model or signal path.

The operation of the delay time calculating apparatus according to the second embodiment will now be discussed with reference to the flowchart in FIG. 7. In step 51, the CPU 2 calculates the reference delay time of one circuit element, as described in step 21 of the first embodiment. In the next step 52, the CPU 2 reads the ID parameter for that circuit element from the sixth data file 41. In step 53, the CPU 2 reads the first coefficient data from the first coefficient table 15.

Next, the CPU 2 determines in step 54 if the second coefficient table 16 is needed in accordance with the read ID parameter. Specifically, the CPU 2 determines whether the ID parameter of the keyword "SOURCE" is "TYPE1" or "TYPE2". When the ID parameter is "TYPE1", the CPU 2 goes to step 55 and selects the aforementioned equation (3) to compute the delay time of the second interface circuit 33b (the circuit element XXX). Then, the CPU 2 computes the delay time of the second interface circuit 33b using the equation (3) in step 58, and stores the delay time data in the fifth data file 17 in step 59. As apparent from the above, the CPU 2 does not access the second coefficient table 16 when computing the delay time of the second interface circuit 33b.

When the ID parameter is "TYPE2", the CPU 2 proceeds to step 56 to compute the delay time of the first interface circuit 33a (the circuit element YYY). The CPU 2 reads the second coefficient data from the second coefficient table 16 in step 56, and selects the aforementioned equation (1) in step 57. Then, the CPU 2 computes the delay time of the first interface circuit 33a using the equation (1) in step 58.

It should be apparent to those skilled in the art that the present invention may be embodied in many other specific forms without departing from the spirit or scope of the invention. For example, the present invention may be adapted to computation of the delay time of a semiconductor device to which three or more operational supply voltages are supplied. When first to third operational supply voltages are supplied to a semiconductor device, it is preferable to prepare the first coefficient table of the process condition, the temperature in use and the first operational supply voltage and the second coefficient table of the first to third operation supply voltages. When the first and second operational supply voltages have a large correlation and the second and third operational supply voltages have a large correlation, it is preferable to prepare the second coefficient table of the first and second operational supply voltages and the third coefficient table of the second and third operational supply voltages. Furthermore, the present invention may be adapted to a semiconductor device which has five or more dependency factors. Therefore, the present examples and embodiments are to be considered as illustrative and not restrictive and the invention is not to be limited to the details given herein, but may be modified within the scope and equivalence of the appended claims.

What is claimed is:

1. A method of computing delay times of circuit elements of a semiconductor device, comprising:

preparing at least two coefficient tables storing a plurality of delay time ratio coefficient values, one of which being a first delay time ratio coefficient value, each of the delay time ratio coefficient values representing a ratio of a delay time determined by values of a plurality of dependency factors having a close correlation with one another to a predetermined reference delay time of a circuit element, the first coefficient table having a first matrix table of the plurality of delay time ratio coefficient values respectively associated with the plurality of dependency factors, one of which being a first dependency factor, and the second coefficient table having a second matrix table of the first delay time ratio coefficient value and a second delay time ratio coefficient value, the first delay time ratio coefficient value being associated with the first dependency factor, and the second delay time ratio coefficient value being associated with a second dependency factor having a close correlation with the first dependency factor;

acquiring at least one of the delay time ratio coefficient values from the first coefficient table and acquiring at least one of the first and second delay time ratio coefficient values from the second coefficient table;

computing a delay time of a circuit element using the acquired delay time ratio coefficient values and a reference delay time; and performing a circuit timing simulation using the delay time.

2. The method according to claim 1, wherein the semiconductor device having a first circuit element for receiving a first operational supply voltage as the first dependency factor, and a second circuit element for receiving the first operational supply voltage and a second operational supply voltage as the second dependency factor, the method further comprising:

preparing a first equation used in computing a delay time of the first circuit element and a second equation used in computing a delay time of the second circuit element;

generating a functional model in which identification data for identifying the first and second circuit elements based on the first and second dependency factors are described; and selecting one of the first and second equations in accordance with the identification data of the functional model.

3. The method according to claim 2, wherein the functional model having a delay time model of the circuit element in which identification data are described.

4. The method according to claim 2, wherein the functional model having a logic model in which identification data are described and in which a function and operation of the circuit element are equivalently represented.

5. The method according to claim 1, wherein the dependency factors having a process condition of the semiconductor device, a temperature of the semiconductor device while in use and first and second operational supply voltages supplied to the semiconductor device; and the first coefficient table stores the plurality of delay time ratio coefficient values associated with the process condition, the temperature in use and a value of the first operational supply voltage and the second coefficient table stores the first and second delay time ratio coefficient values respectively associated with values of the first and second operational supply voltages.

6. An apparatus for computing delay times of circuit elements of a semiconductor device, comprising:

at least two coefficient tables storing a plurality of delay time ratio coefficient values, one of which being a first delay time ratio coefficient value, each of the delay time ratio coefficient values representing a ratio of a delay time determined by values of a plurality of dependency factors having a close correlation with one another to a predetermined reference delay time of a circuit element, said first coefficient table having a first matrix table of the plurality of delay time ratio coefficient values respectively associated with the plurality of dependency factors, one of which being a first dependency factor and said second coefficient table including a second matrix table of the first delay time ratio coefficient value and a second delay time ratio coefficient value, the first delay time ratio coefficient value being associated with the first dependency factor, and the second delay time ratio coefficient value being associated with a second dependency factor having a close correlation with the first dependency factor;

a processing unit for acquiring at least one of the delay time ratio coefficient values from said first coefficient table, acquiring at least one of the first and second delay time ratio coefficient values from said second coefficient table, and computing a delay time of a circuit element using the acquired delay time ratio coefficient values and a reference delay time; and performing a circuit timing simulation using the delay time.

7. The apparatus according to claim 6, wherein:

the semiconductor device having a first circuit element for receiving a first operational supply voltage as the first dependency factor, and a second circuit element for receiving the first operational supply voltage and a second operational supply voltage as the second dependency factor;

said processing unit computes the delay time of the first circuit element according to a first equation and computes the delay time of the second circuit element according to a second equation; and the apparatus further comprising a storage structure for storing a functional model in which identification data for identifying the first and second circuit elements based on the first and second dependency factors are described, wherein said processing unit selects one of the first and second equations in accordance with the identification data of the functional model.

8. The apparatus according to claim 6, wherein the dependency factors having a process condition of the semiconductor device, a temperature of the semiconductor device while in use and first and second operational supply voltages supplied to the semiconductor device; and said first coefficient table stores the plurality of delay time ratio coefficient values associated with the process condition, the temperature in use and a value of the first operational supply voltage and said second coefficient table stores the first and second delay time ratio coefficient values respectively associated with values of the first and second operational supply voltages.

9. A method of generating at least two coefficient tables for use in computing delay times of circuit elements of a semiconductor device, comprising:

computing a plurality of delay time ratio coefficient values, having first and second delay time ratio coefficient values, each of the delay time ratio coefficient values representing a ratio of a delay time determined by values of a plurality of dependency factors, one of which being a first dependency factor, the dependency factors having a close correlation with one another to a predetermined reference delay time of a circuit element;

storing the plurality of delay time ratio coefficient values in the first coefficient table;

storing the first and second delay time ratio coefficient values in the second coefficient table, the first delay time ratio coefficient value being associated with the first dependency factor, and the second delay time ratio coefficient value being associated with a second dependency factor having a close correlation with the first dependency factor;

computing a delay time of a circuit element using the delay time ratio coefficient values; and performing a circuit timing simulation using the delay time.

10. A storage product including a recording medium where a computer readable program code for computing delay times of circuit elements of a semiconductor device is recorded therein, the program executing processes for:

preparing at least two coefficient tables storing a plurality of delay time ratio coefficient values having a first delay time ratio coefficient value, each of the delay time ratio coefficient values representing a ratio of a delay time determined by values of a plurality of dependency factors having a close correlation with one another to a predetermined reference delay time of a circuit element, the first coefficient table having a first matrix table of the plurality of delay time ratio coefficient values respectively associated with the plurality of dependency factors having a first dependency factor and the second coefficient table having a second matrix table of the first delay time ratio coefficient value and a second delay time ratio coefficient value, the first delay time ratio coefficient value being associated with the first dependency factor, and the second delay time ratio coefficient value being associated with a second dependency factor having a close correlation with the first dependency factor;

acquiring at least one of the delay time ratio coefficient values from the first coefficient table and acquiring at least one of the first and second delay time ratio coefficient values from the second coefficient table;

computing a delay time of a circuit element using the acquired delay time ratio coefficient values and a reference delay time; and performing a circuit timing simulation using the delay time.

11. The storage product according to claim 10, wherein the semiconductor device having a first circuit element for receiving a first operational supply voltage as the first dependency factor, and a second circuit element for receiving the first operational supply voltage and a second operational supply voltage as the second dependency factor, the program further executing processes for:

preparing a first equation used in computing a delay time of the first circuit element and a second equation used in computing a delay time of the second circuit element;

generating a functional model in which identification data for identifying the first and second circuit elements based on the first and second dependency factors is described; and selecting one of the first and second equations in accordance with the identification data of the functional model.

12. The storage product according to claim 11, wherein the functional model having a delay time model of a circuit element in which identification data are described.

13. The storage product according to claim 11, wherein the functional model having a logic model in which identification data are described and in which a function and operation of a circuit element are equivalently represented.

14. The storage product according to claim 10, wherein the dependency factors include a process condition of the semiconductor device, a temperature of the semiconductor device while in use and first and second operational supply voltages supplied to the semiconductor device; and the first coefficient table stores the plurality of delay time ratio coefficient values associated with the process condition, the temperature in use and a value of the first operational supply voltage and the second coefficient table stores the first and second delay time ratio coefficient values respectively associated with values of the first and second operational supply voltages.

* * * * *